United States Patent [19]

Yamaka

[11] Patent Number: 4,831,428

[45] Date of Patent: May 16, 1989

[54] INFRARED RAY DETECTION DEVICE

[76] Inventor: Eiso Yamaka, 28-2, Fujigaoka-2-chome, Midorii-ku, Yokohama, Japan

[21] Appl. No.: 851,511

[22] Filed: Apr. 14, 1986

[30] Foreign Application Priority Data

Apr. 19, 1985 [JP] Japan .................................. 60-82265

[51] Int. Cl.$^4$ ................... H01L 29/161; H01L 31/10; H01L 27/15

[52] U.S. Cl. ......................................... 357/30; 357/4; 357/16; 357/24

[58] Field of Search ................... 357/30, 16, 24 LR, 4

[56] References Cited

U.S. PATENT DOCUMENTS

| | | | |
|---|---|---|---|
| 3,242,018 | 3/1966 | Grabmaier et al. | 357/16 |
| 3,626,257 | 12/1971 | Esaki et al. | 357/4 |
| 4,257,057 | 3/1981 | Cheung et al. | 357/16 |
| 4,357,183 | 11/1982 | Fan et al. | 357/16 |
| 4,542,256 | 9/1985 | Weideman | 357/16 |
| 4,561,005 | 12/1985 | Shannon | 357/24 LR |

FOREIGN PATENT DOCUMENTS

| | | | |
|---|---|---|---|
| 0122047 | 10/1984 | European Pat. Off. | 357/4 |
| 58-67073 | 4/1983 | Japan | 357/30 |

OTHER PUBLICATIONS

Sze, *Physics of Semiconductor Devices*, 2nd ed., Wiley & Sons, N.Y., 1981, pp. 749–754, 763–765.

Sze, *Physics of Semiconductors*, 2nd ed., J. Wiley & Sons, p. 829.

*Primary Examiner*—Andrew J. James
*Assistant Examiner*—Jerome Jackson, Jr.
*Attorney, Agent, or Firm*—Stevens, Davis, Miller & Mosher

[57] ABSTRACT

An infrared ray detection device comprises a Si crystal substrate, a $Ge_xSi_{1-x}$ ($0 < x \leq 1$) mixed crystal layer formed on the Si crystal substrate, and a Si crystal layer formed on the $Ge_xSi_{1-x}$ ($0 < x \leq 1$) mixed crystal layer. An electric charge is stored beforehand in a potential well formed in the $Ge_xSi_{1-x}$ ($0 < x \leq 1$) mixed crystal layer, and it acts as a signal carrier when it is irradiated by incident infrared rays to be detected. The component elements of the infrared ray detection device can be formed to have a high quality crystal structure, and the infrared ray detection device can detect incident infrared rays having an optional cutoff wavelength longer than 5.2 $\mu$m with high sensitivity.

4 Claims, 5 Drawing Sheets

INFRARED RAY DETECTION DEVICE

BACKGROUND OF THE INVENTION

1. Field of the Invention

The present invention relates to an infrared ray detection device suitable to detect an infrared ray of a long wavelength from several microns up to about 20 microns.

2. Description of the Related Art

Prior art infrared ray detection devices are manufactured by using:

Compound semiconductors such as InSb, $Hg_xCd_{1-x}Te$ ($0<x<1$), $Pb_xSn_{1-x}Te$ ($0<x<1$), etc.; or an element semiconductor such as Si forming a Schottky barrier at a contact area with a thin metal layer; or an element semiconductor such as Si, Ge, etc. which has been doped with an impurity such as Zn, Cu, etc.

When a two-dimensional infrared ray imaging device is constructed by using such a prior art infrared ray detection device, it is very difficult to obtain a two-dimensional infrared ray imaging device which can detect infrared rays of a wavelength longer than several $\mu m$.

When compound semiconductors are used, for example, since the crystal growth technique for the compound semiconductors is not sufficiently well developed, it is difficult to manufacture a high quality crystal which assures a high electron mobility in the solid state thereof so as to make electronic scanning possible.

Further, in a two-dimensional infrared ray imaging device constructed by using the infrared ray detection device which uses Si to form a Schottky barrier, the cutoff wavelength is approximately 4 $\mu m$ at most even when using a combination of a Pt silicide and a p-type Si which allows a longest wavelength, so that, so far as a Schottky barrier type infrared ray detection device is concerned, it is impossible to obtain a device of any longer wavelength.

Further, in a device which uses the impurity doped Si since there is a limitation on the amount of impurity doping, it is difficult to manufacture a device having an optional cutoff frequency. Besides, such a device has a low infrared absorption factor and hence low sensitivity.

The present invention has been made to overcome the above-mentioned disadvantages of the prior infrared imaging devices.

SUMMARY OF THE INVENTION

It is an object of the present invention to provide an infrared ray detection device which has a structure making it possible to obtain a high quality crystal and which can detect infrared rays having a wavelength longer than 5.2 $\mu m$ with high sensitivity.

The present invention provides, as an example, an infrared ray detection device for use in a two-dimensional infrared ray imaging device which has a $Ge_xSi_{1-x}$ ($0<x\leq1$) mixed crystal layer of one conductivity type formed on a Si crystal substrate (or layer) of the same conductivity type and a conductive layer formed on the $Ge_xSi_{1-x}$ ($0<x\leq1$) mixed crystal layer, and, more particularly, wherein the conductive layer is a $Ge_ySi_{1-y}$ ($0\leq y<x$) mixed crystal layer of the same conductivity type as that of the Si crystal substrate (or layer) or a metal film.

As other examples, the present invention provides an infrared ray detection device for use in a two-dimensional infrared ray imaging device which comprises a Si crystal substrate (or layer), a $Ge_xSi_{1-x}$ ($0<x\leq1$) mixed crystal layer formed on the Si crystal substrate (or layer) and a conductive layer formed on the $Ge_xSi_{1-x}$ ($0<x\leq1$) mixed crystal layer, and, more specifically, wherein the conductive layer may be a $Ge_ySi_{1-y}$ ($0\leq y<x$) mixed crystal layer and further suitable combinations of conductivity types may be chosen for the constituent substrate and layers.

As a further example, the present invention provides an infrared ray detection device which has the above-mentioned structure and which is coupled with a transfer device incorporated with the Si crystal substrate for transferring an electric charge (electrons or holes) from the infrared ray detection device, upon irradiation of the infrared ray detection device by incident infrared rays to be detected.

With the structure of the device of the present invention, which is obtained by using the crystal layers which can be grown by a conventional crystal layer growth technique used for growing Si and Ge crystal layers, etc., it is possible to easily obtain an infrared ray detection device which can detect infrared rays of a long wavelength from 5 to 20 $\mu m$, for example, with high sensitivity.

DESCRIPTION OF THE PREFERRED EMBODIMENTS

An embodiment of the present invention will be explained with reference to FIG. 1.

Figure 1:
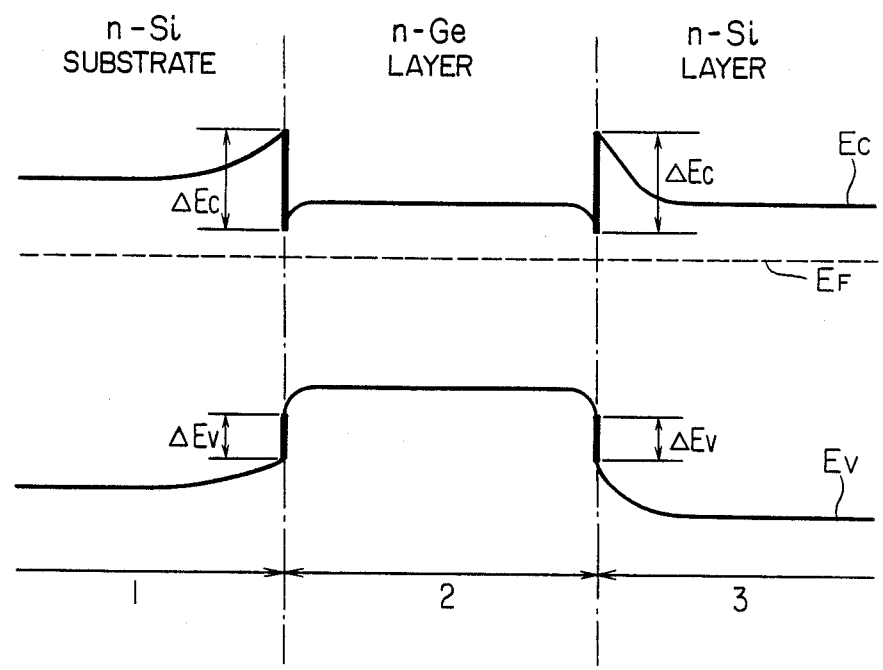
FIG. 1 is an energy band diagram of the device of an embodiment of the present invention when the device is in the state of thermal equilibrium.

The infrared ray detection device of an embodiment of the present invention whose energy band is illustrated in FIG. 1, which also schematically shows the arrangement order of the component parts thereof, comprises, as an example, an n-type Ge crystal layer 2 formed on an n-type Si crystal substrate 1 and an n-type Si crystal layer 3 formed on the n-type Ge crystal layer 2.

FIG. 1 shows the energy band of the infrared ray detection device of an embodiment of the present invention when the device is in the state of thermal equilibrium.

Further, in FIG. 1, symbol $E_F$ represents Fermi level, $E_c$ represents a conduction band bottom level, $E_v$ represents a valence band top level, and $\Delta E_c$ and $\Delta E_v$ represent band discontinuities appearing inside the conduction bands and the valence bands, respectively. The n-type Ge crystal layer 2 may be generally termed an n-type $Ge_xSi_{1-x}$ $(0<x\leq 1)$ mixed crystal layer and the n-type Si crystal layer 3 may be generally termed as an n-type $Ge_ySi_{1-y}$ $(0\leq y<x)$ mixed crystal layer. In the example illustrated in FIG. 1, $x=1$ and $y=0$ hold.

As seen from FIG. 1, with such a structure of laminated crystal layers, an interface between the n-type Si crystal substrate 1 and the n-type Ge crystal layer 2 and an interface between the n-type Ge crystal layer 2 and the n-type Si crystal layer 3 form respective heterojunctions, where lack of the band discontinuities $\Delta E_c$ at these heterojunctions becomes a potential barrier against electrons in the conduction band of the n-type Ge crystal layer 2. Thus, in this case, a potential well is formed in the conduction band of the n-type Ge crystal layer 2 by being surrounded by the band discontinuities the conduction band of the n-type Ge crystal layer 2 and the respective conduction bands of the n-type Si crystal substrate 1 and the n-type Si crystal layer 3, as shown in FIG. 1. If an electric charge (electrons) have been injected into this potential well beforehand by some means and thereafter infrared photons having energy greater than $\Delta E_c$ are applied to the electrons to be absorbed thereby, the electrons are transferred into the n-type Si crystal substrate 1 or the n-type Si crystal layer 3, which electrons are then transferred to an external circuit to produce an electric signal. According to known data, the forbidden band width $(E_c-E_v)$ of the Si crystal layer 3 is 1.11 eV (1.12 μm), the forbidden band width $(E_c-E_v)$ of the Ge crystal layer 2 is 0.67 eV (1.85 μm), $\Delta E_c$ is 0.24 eV (5.2 μm) and $\Delta E_v$ is 0.2 eV (6.2 μm), where the numerical value shown in each of the parentheses shows the wavelength of the light having photons equivalent to the energy given in eV. (More specifically, refer to Solid State Commu. by G. Margaritondo et al. 43, 1982, 163.)

The above operations are described in further detail.

The injection of electrons into the potential well formed in the conduction band of the n-type Ge crystal layer 2 can be effected by one of the steps of:

(1) using a conventional injection method of employing a MOS gate for transferring electrons from a bias charge cell into the potential well formed in the conduction band of the n-type Ge crystal layer 2;

(2) applying a forward bias voltage for a predetermined time period between the n-type Si crystal substrate 1 and the n-type Si crystal layer 3 so that the n-type Si crystal substrate 1 or the n-type Si crystal layer 3 becomes positive relative to the n-type Ge crystal layer 2 thereby to inject a predetermined amount of electrons into the potential well formed in the conduction band of the n-type Ge crystal layer 2; and (3) irradiating the n-type Si crystal substrate 1 or the n-type Si crystal layer 3 by a predetermined amount of biasing light of a wavelength shorter than 1.12 μm corresponding to the forbidden band width $(E_c-E_v)$ of Si so that a part of electrons generated thereby is injected into the potential well formed in the conduction band of the n-type Ge crystal layer 2.

When the electrons stored in the conduction band of the n-type Ge crystal layer 2 are irradiated by incident infrared rays, the electrons absorb the infrared rays and enter an excited state. If the energy level of the infrared photons of the incident infrared rays is higher than the band discontinuity $\Delta E_c$, the electrons are allowed to transfer to the conduction band of the n-type Si crystal substrate 1 or the n-type Si crystal layer 3.

In this case, the number of electrons transferring to the n-type Si crystal substrate 1 or the n-type Si crystal layer 3 is proportional to the amount of the incident infrared rays. Therefore, the device can function as an infrared ray detection device having a cutoff wavelength whose energy is equal to the band discontinuity $\Delta E_c$.

Further, by detecting the number of electrons which have been transferred to and stored in the n-type Si crystal substrate 1 or the n-type Si crystal layer 3 during the time period between one injection of electrons and the next injection of electrons into the potential well formed in the conduction band of the n-type Ge crystal layer 2 or by measuring the number of electrons injected into the potential well formed in the conduction band of the n-type Ge crystal layer 2 at the time of succeeding application of the forward bias voltage, it is possible to detect the value of the integrated intensity of the incident infrared rays.

Figure 2:
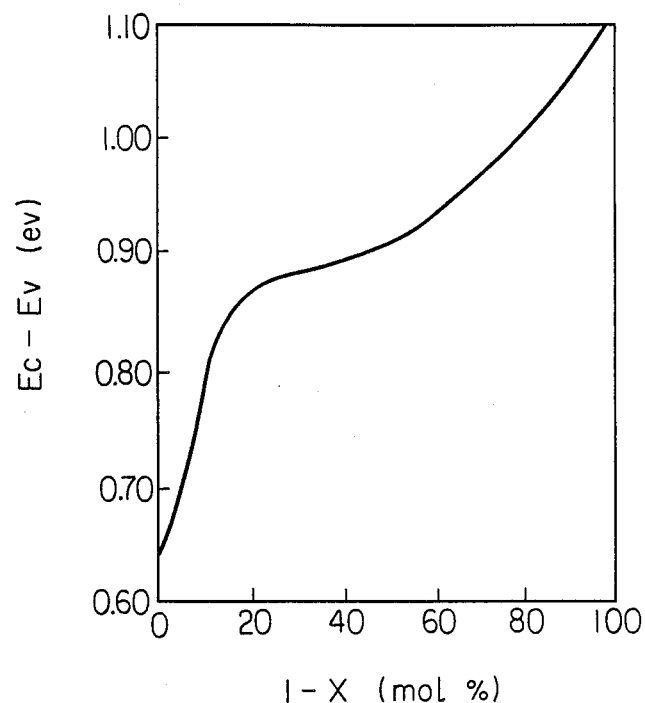
FIG. 2 is a characteristic diagram illustrating the relation of the forbidden band width $E_c-E_v$ versus the value of 1-x of the $Ge_xSi_{1-x}$ mixed crystal.

FIG. 2 shows the relation of the forbidden band width $(E_c-E_v)$ eV versus the Si content in mol % of a $Ge_xSi_{1-x}$ mixed crystal layer. In FIG. 2, the ordinate represents the forbidden band width $(E_c-E_v)$ eV and the abscissa represents $1-x$ (mol %). (More specifically, refer to R. Braunstein, A. R. Moore and F. Herman, Phys. Rev. 109, 1958, 695.)

In the embodiment shown in FIG. 1, $x=1$ and $y=0$. However, when the mixed crystal layer of the n-type $Ge_xSi_{1-x}$ $(0<x\leq 1)$ is used generally as the crystal layer 2, as the value of x varies from 1 to zero in FIG. 2, the forbidden band width $(E_c-E_v)$ eV continuously varies from the forbidden band width value of Ge to that of Si.

Thus, by virtue of this phenomenon, it is possible to change continuously the band discontinuity $\Delta E_c$, which produces the potential barrier against the electrons in the potential well formed in the conduction band of the n-type $Ge_xSi_{1-x}$, between 0.24 eV and zero eV by changing the value of x. As a result, by changing the value of x of the $Ge_xSi_{1-x}$ mixed crystal, it is possible to obtain an infrared ray detection device having an optional cutoff wavelength longer than 5.2 μm.

Figure 3:
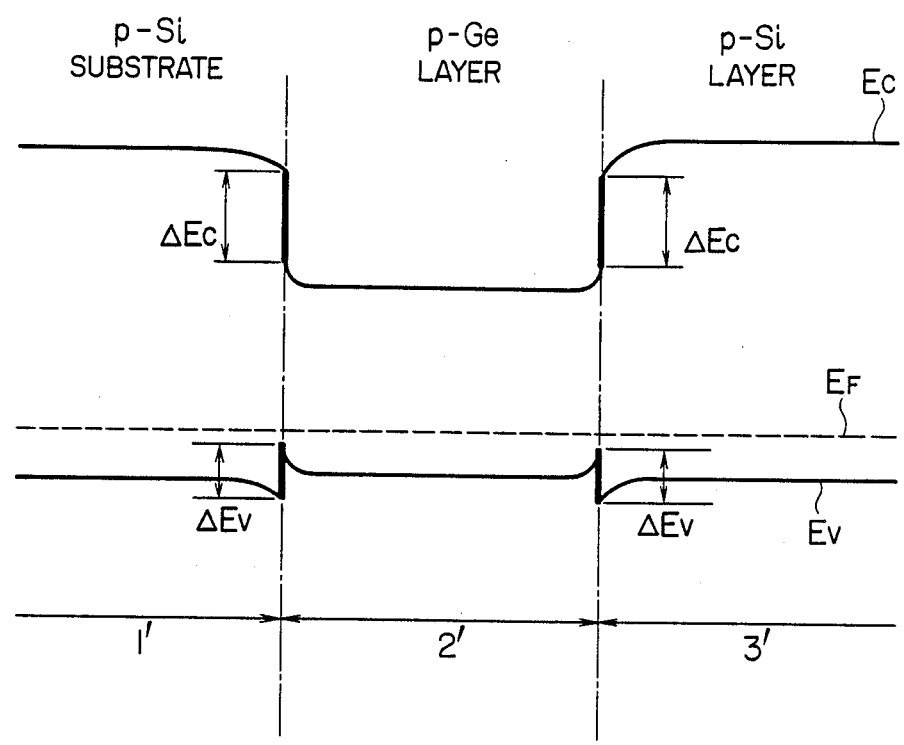
FIG. 3 is an energy band diagram of the device of another embodiment of the present invention when the device is in the state of thermal equilibrium.

FIG. 3 shows an energy band diagram of the infrared ray detection device of another embodiment of the present invention when the device is in the state of thermal equilibrium. In FIG. 3, like reference numerals and symbols such as used in FIG. 1 denote the same or equivalent elements or parts, or they are used in the same sense as in FIG. 1.

In FIG. 3, numeral 1' denotes a p-type Si crystal substrate, numeral 2' denotes a p-type Ge crystal layer, and numeral 3' denotes a p-type Si crystal layer. Also in this embodiment, when represented generally, the p-type Ge crystal layer 2' is a p-type $Ge_xSi_{1-x}$ $(0<x\leq 1)$ mixed crystal, and the p-type Si crystal layer 3' is a p-type $Ge_ySi_{1-y}$ $(0\leq y<x)$ mixed crystal.

This embodiment shown in FIG. 3 differs from the embodiment shown in FIG. 1 in that the conductivity type of each of the crystals in FIG. 3 is the p-type contrary to the n-type of FIG. 1 and hence, in FIG. 3, the potential barriers caused by the band discontinuities $\Delta E_v$ generated at the valence band level $E_v$ at the heterojunctions between the p-type Si and the p-type Ge are utilized as the potential barriers for forming the potential well in the valence band of the p-type Ge crystal layer 2'.

In this embodiment shown in FIG. 3, except that the carriers are holes, the operation is the same as that of the embodiment shown in FIG. 1.

In the structure of the device of each of the embodiments shown in FIGS. 1, 2 and 3, the Ge crystal layer and the Si crystal layer are sequentially grown on the Si crystal substrate. However, as a modification thereof, the Si crystal layer formed on the Ge crystal layer may be replaced by a metal layer. In this case, the metal layer produces a potential barrier similar to that of the Si crystal layer. Also with this modified structure, an operation and functional effect which are the same as those of the embodiments shown in FIGS. 1, 2 and 3 can be attained.

Figure 4:
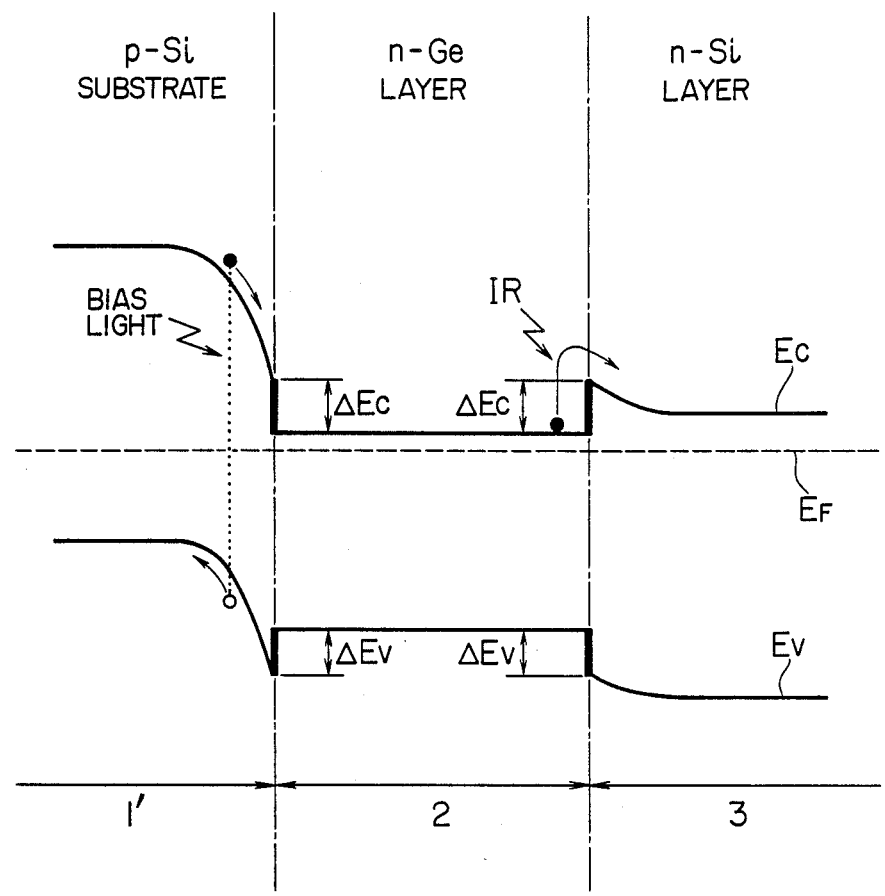
FIG. 4 is an energy band diagram of the device of a further embodiment of the present invention when the device is in the state of thermal equilibrium and also the process of applying biasing light to the device and infrared rays to be detected by the device.

FIG. 4 shows an energy band diagram of the infrared ray detection device of a further embodiment of the present invention when the device is in the state of thermal equilibrium, which device comprises an n-type Ge crystal layer 2 formed on an p-type Si crystal substrate 1' and an n-type Si crystal layer 3 formed on the above-mentioned n-type Ge crystal layer 2. FIG. 4 also illustrates the process of applying biasing light of a wavelength shorter than 1.12 $\mu$m to this device and thereafter detecting incident infrared rays IR by this device.

As a preparatory process before effecting infrared ray detection by using the device of this embodiment shown in FIG. 4, it is necessary to irradiate a required portion of the device by a predetermined amount of biasing light so that electrons are injected into the potential well formed in the conduction band of the n-type Ge crystal layer 2 in FIG. 4. More specifically, the preparatory process includes the step of irradiating the p-n heterojunction formed between the p-type Si crystal substrate 1' and the n-type Ge crystal layer 2 by biasing light of a wavelength shorter than 1.12 $\mu$m and having sufficient energy greater than the forbidden band width ($E_c E_v$) of Si. As a result, electrons are generated in the conduction band and holes are generated in the valence band of the p-type Si crystal substrate 1', respectively. The electrons generated in the conduction band of the p-type Si crystal substrate 1' are injected into the potential well of the n-type Ge crystal layer 2 and simultaneously the holes generated in the valence band of the p-type Si crystal substrate 1' are moved away from the p-n heterojunction between the p-type Si crystal substrate 1' and the n-type Ge crystal layer 2, under the influence of the internal electric field generated at the p-n heterojunction.

Next, in the process of detecting incident infrared rays by using this device which has been subjected to the above-described preparatory process, the electrons injected into the potential well of the n-type Ge crystal layer 2 are irradiated by the infrared rays IR of a wavelength shorter than the cutoff wavelength of 5.2 $\mu$m corresponding to the band discontinuity $\Delta E_c$ of 0.24 eV, as shown in FIG. 4. Then, the electrons absorb the energy supplied by the incident infrared rays IR and are transferred into the n-type Si crystal layer 3 to become an electrical carrier. These electrons are then picked up and transferred to an electric signal detecting and processing apparatus through a signal transfer device, both of which are not shown in the drawing.

In addition to the combinations of the conductivity types of the component elements of the infrared ray detection device of this invention such as shown in FIGS. 1, 3 and 4, other suitable conductivity type combinations such as (n, n, p); (n, p, p); and (p, p, n) in the order of the Si substrate, Ge layer and Si layer may be chosen.

Also, in the device of the embodiment shown in FIG. 4, the n-type Ge crystal layer 2 may be generally the n-type $Ge_xSi_{1-x}$ ($0 < x \leq 1$) mixed crystal layer. Therefore, with the structure of the device of this embodiment, it is possible to provide an infrared ray detection device for detecting infrared rays having an optional cutoff wavelength longer than 5.2 $\mu$m by changing the value of x of the n-type $Ge_xSi_{1-x}$ mixed crystal layer and thereby changing the value of the band discontinuity $\Delta E_c$ between 0.24 eV and zero eV continuously.

Figure 5:
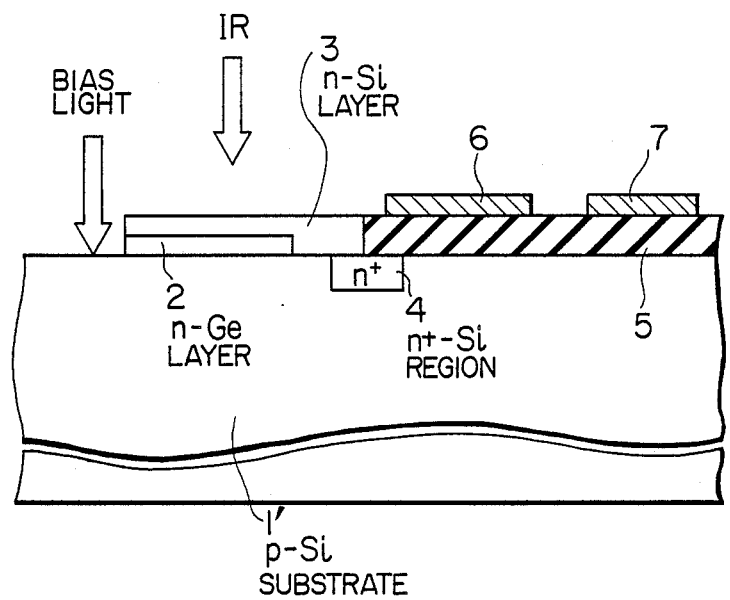
FIG. 5 is a partial sectional side view for illustrating the structure of the device shown in FIG. 4 and also the transfer device coupled thereto.

FIG. 5 is a partial sectional side view showing the structure of the device of the embodiment of the present invention shown in FIG. 4. In FIG. 5, like reference numerals and symbols such as used in FIG. 4 denote the same or equivalent elements or parts, or they are used in the same sense as in FIG. 4.

Also, in FIG. 5, an n-type $Ge_xSi_{1-x}$ ($0 < x \leq 1$) mixed crystal layer may be used more generally in place of the n-type Ge crystal layer 2.

This embodiment in FIG. 5 is illustrated to show a silicon monolithic type infrared ray imaging device which comprises a combination of the infrared ray detection device shown in FIG. 4 and a charge coupled device (CCD) operating as an electrical carrier (signal electrons in this case) transfer device. The infrared ray detection device, which operates stably to detect incident infrared rays having a long wavelength and which is necessary for use in the above-mentioned imaging device, can be provided only in accordance with the present invention.

In FIG. 5, symbol IR indicates incident infrared rays to be detected, numeral 4 denotes an $n^+$-type storage cell. Numeral 5 denotes an electrical insulator such as $SiO_2$. Numeral 6 denotes a transfer gate functioning as an electrode for transferring signal electrons, which have been produced in the n-type Si crystal layer 3 due to the irradiation thereof by the incident infrared rays IR, to an input of a CCD which operates to transfer the signal electrons to an output of the infrared ray imaging device. Numeral 7 denotes a CCD gate for controlling the transfer of the signal electrons to the succeeding locations in the CCD.

As described above, the device of the embodiment shown in FIG. 5 has the structure which has the infrared ray detection device of the present invention coupled with a common CCD through the transfer gate 6.

Further, though the infrared ray imaging device shown in FIG. 5 comprises a combination of the infrared ray detection device shown in FIG. 4 and a CCD, other infrared ray detection devices of such types as shown in FIGS. 1 and 3, for example, may be used in place of the infrared ray detection device of the type shown in FIG. 4. In such a case, electrons or holes may act as an electrical carrier depending on the conductivity type of the Si crystal substrate used in each device.

It is possible to obtain the infrared ray imaging device having the above-described structure by virtue of the fact that the infrared ray detection device of the present invention uses a Si crystal as the substrate thereof.

A high quality Si crystal can be manufactured by conventional crystal growth techniques, so that, when any other devices are formed thereon, excellent performance characteristics for the device are assured. Therefore, the structure of the infrared ray detection device of the present invention is extremely advantageous as it can be formed in an integrated structure. By contrast, it is absolutely impossible to have such an advantage, if the compound semiconductors such as described at the beginning of this specification are used.

In accordance with the infrared ray detection device of the present invention having the above-described structure, it is possible to detect infrared rays having an optional cutoff wavelength longer than 5.2 μm by selecting a suitable value of x of the $Ge_xSi_{1-x}$ mixed crystal layer thereby to give a suitable value of the potential barriers which form the potential well. Since all of the crystals used in the device of the present invention can be grown by well-established crystal layer growth techniques, it is possible to obtain easily high quality crystals necessary for use in the device of the present invention. Thus, the present invention is highly advantageous in manufacturing an integrated semiconductor device such as the two-dimensional infrared ray imaging device.

I claim:

1. An infrared ray detection device which comprises a p-type Si crystal substrate, an n-type $Ge_xSi_{1-x}$ $(0<x\leq 1)$ mixed crystal layer formed on said p-type Si crystal substrate, a potential well formed in said n-type $Ge_xSi_{1-x}$ $(0<x\leq 1)$ mixed crystal layer, means for causing an electric charge to be stored in said potential well prior to application of incident rays to be detected, and an n-type Si crystal layer formed on said n-type $Ge_xSi_{1-x}$ $(0<x\leq 1)$ mixed crystal layer, and which is coupled with a transfer device incorporated with said p-type Si crystal substrate comprising means for transferring from said infrared ray detection device said electric charge stored beforehand in said potential well upon irradiation of said electric charge by said incident infrared rays to be detected.

2. An infrared ray detection device which comprises an Si crystal substrate, a $Ge_xSi_{1-x}$ $(0<x\leq 1)$ mixed crystal layer formed on said Si crystal substrate, a Si crystal layer formed on said $Ge_xSi_{1-x}$ $(0<x\leq 1)$ mixed crystal layer, means for producing band discontinuities, Ec inside a conduction band and Ev inside a valence band, at respective heterojunctions between said $Ge_xSi_{1-x}$ $(0<x\leq 1)$ mixed crystal layer and said Si crystal substrate and between said $Ge_xSi_{1-x}$ $(0<x\leq 1)$ mixed crystal layer and said Si crystal layer, said band discontinuities comprising potential barriers in order to form a potential well in said $Ge_xSi_{1-x}$ $(0<x\leq 1)$ mixed crystal layer in which an electric charge is stored prior to application of incident rays to be detected, and means for transferring said electric charge acting as a signal carrier from said potential well into one of said Si crystal layer and said Si crystal substrate when said electric charge is irradiated by said incident infrared rays to be detected, and which is coupled with a transfer device incorporated with said Si crystal substrate comprising means for transferring said electric charge from said infrared ray detection device.

3. An infrared ray detection system comprising:

an infrared ray detection device which comprises a p-type Si crystal substrate, an n-type $Ge_xSi_{1-x}$ $(0<x\leq 1)$ mixed crystal layer formed on said p-type Si crystal substrate, a potential well formed in said n-type $Ge_xSi_{1-x}$ $(0<x\leq 1)$ mixed crystal layer, means for causing an electric charge to be stored in said potential well prior to application of incident rays to be detected, and an n-type Si crystal layer formed on said n-type $Ge_xSi_{1-x}$ $(0<x\leq 1)$ mixed crystal layer, and a transfer device coupled to said detection device comprising means for transferring from said infrared ray detection device an electric charge stored beforehand in said potential well upon irradiation of said electric charge by said incident infrared rays to be detected.

4. An infrared ray detection system comprising:

an infrared ray detection device comprising a Si crystal substrate, $Ge_xSi_{1-x}$ $(0<x\leq 1)$ mixed crystal layer formed on said Si crystal substrate, a Si crystal layer formed on said $Ge_xSi_{1-x}$ $(0<x\leq 1)$ mixed crystal layer, means for producing band discontinuities, Ec inside a conduction band and Ev inside a valence band, at respective heterojunctions between said $Ge_xSi_{1-x}$ $(0<x\leq 1)$ mixed crystal layer and said Si crystal substrate and between said $Ge_xSi_{1-x}$ $(0<x\leq 1)$ mixed crystal layer and said Si crystal layer, said band discontinuities comprising potential barriers in order to form a potential well in said $Ge_xSi_{1-x}$ $(0<x\leq 1)$ mixed crystal layer in which an electric charge is stored prior to application of incident rays to be detected, and means for transferring said electric charge acting as a signal carrier from said potential well into one of said crystal layer and said Si crystal substrate when said electric charge is irradiated by said incident infrared rays to be detected, and a transfer device coupled to said infrared ray detection device comprising means for transferring said electric charge from said infrared ray detection device.

* * * * *